United States Patent [19]

McKean

[11] 4,203,809
[45] May 20, 1980

[54] COPPER FOIL HYPOCHLORITE TREATMENT METHOD AND PRODUCT PRODUCED

[76] Inventor: Walter A. McKean, 116 Meredith Rd., Colonia, N.J. 07067

[21] Appl. No.: 555,180

[22] Filed: Mar. 4, 1975

Related U.S. Application Data

[63] Continuation of Ser. No. 40,832, May 27, 1970, abandoned.

[51] Int. Cl.$^2$ ............................ C25D 5/32; C23F 1/00
[52] U.S. Cl. ................................. 204/32 R; 156/666; 156/667; 252/79.1
[58] Field of Search ................. 204/32 R, 29, 129.75; 156/18, 151, 2, 666, 667; 252/79.1; 148/6.14

[56] References Cited

U.S. PATENT DOCUMENTS

| 1,709,327 | 4/1929 | Spalding et al. | 156/14 |
| 3,150,016 | 9/1964 | Gillette | 148/6.14 |
| 3,231,503 | 1/1966 | Laue | 252/79.1 |
| 3,328,275 | 6/1967 | Waterbury | 204/29 X |

FOREIGN PATENT DOCUMENTS 1163663  9/1958  France .
1155398  1/1969  France .

OTHER PUBLICATIONS

G. N. Quam, Food Industries, pp. 366-367, Aug., 1930.
Fred M. Grant, 25th Annual Report, International Assoc. of Milk Sanitarians, pp. 9-14, (1937).
Mellor, "Comprehensive Treatise on Inorganic & Theoretical Chem.," p. 81, (1946).

Primary Examiner—G. L. Kaplan
Attorney, Agent, or Firm—Finnegan, Henderson, Farabow, Garrett & Dunner

[57] ABSTRACT

A process for improving the surface characteristics of copper foil involving the treatment of such foil with an aqueous alkali metal hypochlorite solution. Copper foil produced thereby.

16 Claims, 1 Drawing Figure

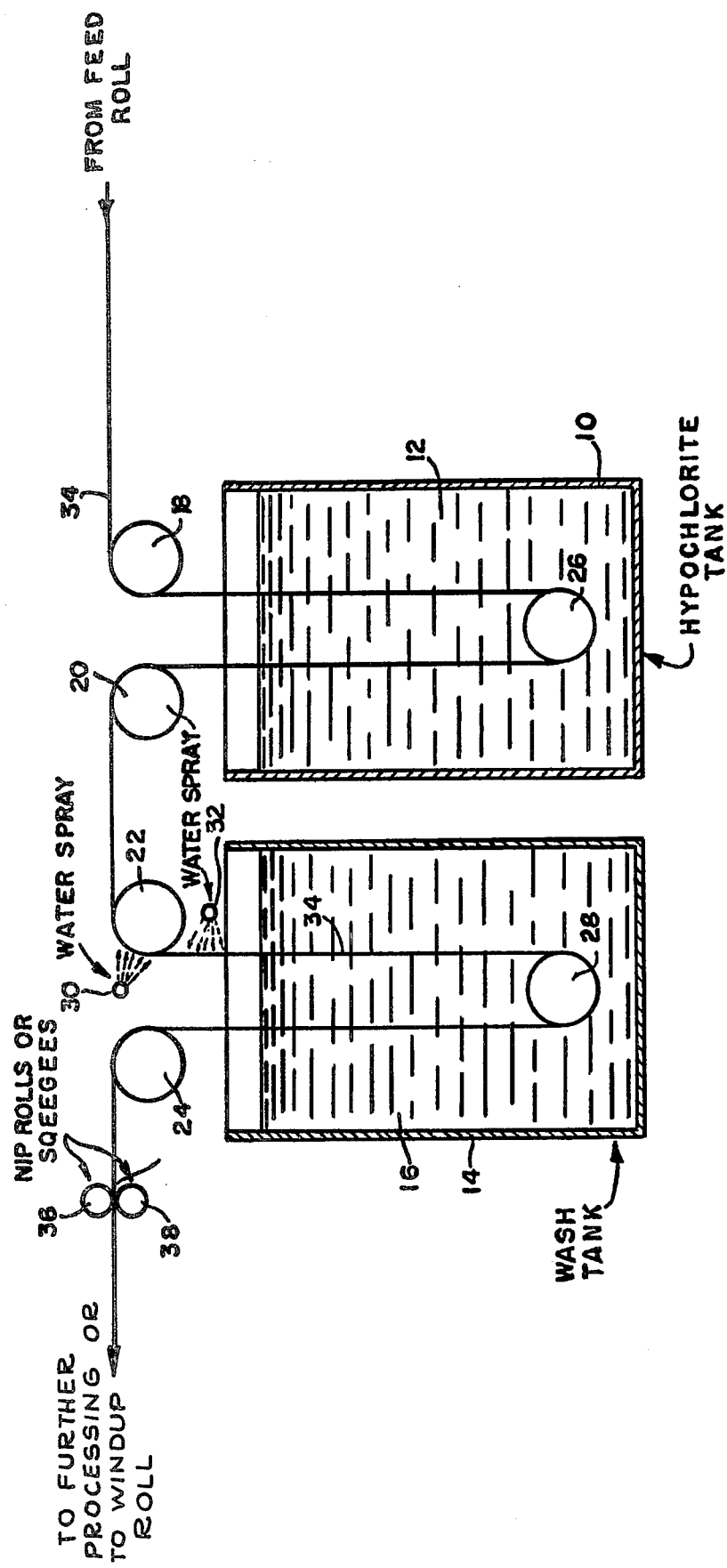

COPPER FOIL HYPOCHLORITE TREATMENT METHOD AND PRODUCT PRODUCED

This is a continuation of Ser. No. 40,832 filed May 27, 1970 and now abandoned.

BACKGROUND OF THE INVENTION

One of the problems with which manufacturers of copper foil (both of the electrolytic and rolled variety) are faced is the staining of the copper foil between the time of shipment and the time of use by the ultimate purchaser. This staining results from exposure of the copper to normal atmospheric and other conditions and, particularly for applications of the copper foil in critical areas such as printed circuitry, is an extremely undesirable characteristic.

In order to overcome this problem, it has been common in the past to subject copper foil to a stainproofing treatment, a typical such treatment involving the use of aqueous chromate solutions. While such treatments have been successful in overcoming the staining problems referred to above, however, the stainproofing treatment itself has, on occasion, created collateral problems.

One such problem has occurred in the etching of stainproofed copper foil for printed circuit applications. More specifically, it has been found that stainproofed foil, i.e., copper foil which has been subjected to a chromate stainproofing treatment, may render the foil resistant to an acid etching treatment such as the standard ferric chloride etch used to prepare printed circuit boards. This resistance to etching of the stainproofed copper foil, of course, renders it substantially unusable for printed circuit applications.

SUMMARY OF THE INVENTION

In accordance with the present invention, a novel technique is provided for the treatment of copper foil which permits the stainproofing of the foil yet does not impair the etchability of the foil for printed circuit applications. This technique essentially involves the treatment of the copper foil with an aqueous alkali metal hypochlorite solution. The treatment of copper foil with such solution also serves to improve the surface characteristics of the copper foil in other respects, as well.

OBJECTS OF THE INVENTION

It is an important object of the present invention to provide a novel process for treating copper foil to permit it to be stainproofed without reducing its etchability characteristics involving the treatment of the foil with an aqueous alkali metal hypochlorite solution.

Other important objects of the present invention are:

(1) to improve the nature of the electrolytic surface treatment applied to copper foil by pre-treating the foil with an aqueous alkali metal hypochlorite solution;

(2) to provide a process for improving the surface characteristics of copper foil involving the treatment of such foil with an aqueous sodium hypochlorite solution;

(3) to provide a process for improving the surface characteristics of copper foil comprising the treatment of such foil with an aqueous sodium hypochlorite solution containing about 2½–15 percent by weight of sodium hypochlorite at a temperature of about 110°–160° F. for about 5–30 seconds;

(4) to produce improved copper foil treated by the foregoing processes; and (5) to provide other important objects and advantages of the present invention which will become more apparent as this description proceeds.

DESCRIPTION OF THE DRAWING

FIG. 1 is a front elevation of a schematic illustrating a system for carrying out the process of the present invention.

DETAILED DESCRIPTION OF THE INVENTION

As previously noted, the material to be subjected to the present surface treatment technique is sheet copper. While electrodeposited copper foil is preferred (particularly for printed circuit applications), other types of sheet copper (such as rolled foil) may be used.

Since one of the more significant advantages of the process of the present invention is that it permits printed circuit grade copper foil to be stainproofed without reducing its etchability, the immediately ensuing description of the preferred embodiment of the present invention will be described in connection with the surface treatment of electrolytically formed copper foil which has previously been electrochemically treated to form a microcrystalline, powdery electrodeposit to improve its bond strength and which has also been stainproofed through the use of an aqueous chromate treatment. An example of such an electrochemical treatment to improve bond strength is disclosed in Waterbury U.S. Pat. No. 3,328,275 and Conley et al U.S. Pat. No. 3,220,897, the disclosures of which are hereby incorporated herein by reference. An example of such an aqueous chromate treatment is disclosed in U.S. Ser. No. 830,789, filed June 5, 1969, now U.S. Pat. No. 3,625,844, the disclosure of which is hereby expressly incorporated herein by reference.

The preferred method for surface treating such foil is to use an elongated sheet of such foil and to pass such elongated sheet through an appropriate processing system such as is illustrated in the single sheet of drawing. The system illustrated therein comprises a tank 10 adapted to contain hypochlorite solution 12 and a tank 14 adapted to contain a water wash 16. Positioned above the tank 10 are two rollers 18 and 20 with two similar rollers 22 and 24 being positioned above tank 14. Rollers 26 and 28 are positioned respectively near the bottoms of tanks 10 and 14. Water sprays 30 and 32 are positioned adjacent roller 22 for the spraying of water on each side of a moving sheet of copper 34. Nip rolls or squeegees 36 and 38 are positioned downstream of roller 24 to remove excess liquid from the surface of the treated and washed copper foil.

A warm air dryer (not shown) is positioned downstream of nip rolls 36 and 38. A sheet of copper 34 to be subjected to the hypochlorite surface treatment is moved around and over roller 18 into the hypochlorite solution in tank 10, passing down around roller 26 and back up out of tank 10 around roller 20. As the copper foil passes around roller 22, it is subjected to a water spray to wash the hypochlorite off the surface of the foil. The treated foil is subjected to a further dip wash as it moves through tank 14 around roller 28 and back up around roller 24. The excess liquid is removed from the copper foil by means of nip rolls or squeegees 36 and 38.

It is then subjected to a warm air drying treatment (not shown) and passed onto further processing or wound on a winding reel as desired. As will be apparent, the various drive mechanisms, liquid inlets and outlets and the like are not shown but are of a conventional variety.

The hypochlorite solution utilized in tank 10 is an aqueous alkali metal hypochlorite solution and is preferably an aqueous sodium hypochlorite solution. While the preferred percent by weight of hypochlorite in the treatment solution is approximately 3-7% (with best results being obtained at about 5%), the hypochlorite content of the aqueous solution may vary over a wide range. By way of example, a more dilute solution such as one containing 2½% by weight of hypochlorite will serve effectively to permit the copper foil to be stainproofed without reducing its etchability but the solution will retain its effectiveness only for a limited period of time and will not work as well as a 5% by weight hypochlorite solution. At higher hypochlorite concentrations (i.e., such as about 15%), similarly usable results are obtainable, though the foil tends to have a golden brown color imparted to it and the solution is not as stable at the preferred operating temperatures as is the 5% solution. The higher concentration solutions are, of course, not as economical as solutions in lower concentrations such as those in the preferred range.

The copper foil should be treated with the aqueous hypochlorite solution at a temperature of about 110°-160° F. At temperatures much below 110° F., the surface treatment of the present invention is not particularly effective. At temperatures much above 160° F., the hypochlorite solution tends to decompose and lose strength rapidly. The preferred temperature is about 130°-140° F. since this temperature range provides most effective results while permitting the foil speed to be set at a desirable rate.

The foil should preferably be subjected to the hypochlorite treatment for at least about 5 seconds. Increasing the treatment time is not deleterious to the foil insofar as its etchant properties are concerned but does tend to stain and perhaps slightly etch the foil surface as well. The practical maximum time of immersion of the foil in the hypochlorite solution is, accordingly, about 30 seconds. The preferred time of immersion is about 8-10 seconds, with particularly excellent results being obtained at a 10 second immersion time.

Following the hypochlorite treatment, it is desirable to remove excess hypochlorite which, if left on the copper foil, might tend to stain it. While such staining would not affect the etchability of the foil, it does create a cosmetic problem and is accordingly undesirable. The particular wash system illustrated in the drawing is quite effective to remove most if not all of the hypochlorite from the surface of the foil. The water sprays emitted from jets 30 and 32 serve as a considerable aid to the subsequent water wash in tank 14.

The extent of water washing is not critical. Too little washing will, as noted, create a cosmetic problem but will not create an etching problem. Too much washing won't hurt but might be inefficient. For best results, the foil is subjected to the water spray and water dip in tank 14 for approximately twice as long as the foil is exposed to the hypochlorite treatment, viz., a twenty second water wash when a ten second hypochlorite treatment is used. If the foil is intended to be passed directly into an etching tank, a water wash of a duration approximately equal to that of the hypochlorite treatment may be employed with excellent results.

Copper foil subjected to a hypochlorite treatment in the foregoing manner makes possible even and rapid attack of the foil surface by etching solutions such as the ferric chloride acid solutions conventionally used in printed circuit applications. The exact reason for this phenomenon is not fully understood. On the one hand, it is felt that copper foil treated with a hypochlorite solution in the foregoing manner modifies the foil surface so that it becomes hydrophilic so as to promote uniform wetting of the foil surface both with water and with etchants. In the case of copper foil which has been stainproofed with a heavy chromate treatment, the chromate treatment apparently forms a complex copper-chromium coating of varying thickness and susceptibility to attack by acids. The hypochlorite treatment of the present invention apparently serves to remove a portion of this complex copper-chromium coating (about 40-60% of it) so that the remaining portion of the coating is easily penetrated by etchants.

As an example of the carrying out of the process of the present invention, a sheet of copper foil is selected which has previously been given electrochemical treatment to coat at least one of its surfaces with a microcrystalline powdery, copper electrodeposit (by a process such, for example, as is described in U.S. Pat. No. 3,220,897 to Conley et al) and which has thereafter been subjected to a chromate stainproofing treatment (such, for example, as is described in Ser. No. 830,879 filed June 5, 1969). This foil is passed through a 5% by weight aqueous sodium hypochlorite solution at 130° F. for 10 seconds. Immediately following the 10 second immersion, the foil is given a 20 second water wash through a combined spray and water dip such as is illustrated in the drawing. Immediately following this water wash, the hypochlorite treated copper foil is subjected for one minute to an aqueous 5% by weight ferric chloride solution which is at room temperature, followed by a one minute hydrochloric acid treatment (10% by weight of HCl) at room temperature. The result is an evenly and rapidly etched foil surface.

In the preceding portions of the specification, a process was described for improving the etchability of copper foil which had been subjected both to an electrochemical treatment to improve its bond strength and to a stainproofing treatment. While the hypochlorite treatment technique of the present invention is particularly well suited for that purpose, however, significant benefits from the hypochlorite treatment may also be obtained by subjecting copper foil to a hypochlorite treatment prior to treatment of the foil to increase its bond strength and the stainproofing of the foil. More specifically, when copper foil is treated with the instant hypochlorite solution in the exact manner indicated previously in the preferred embodiment of the invention, the subsequent electrochemical treatment of the foil for the purpose of placing a microcrystalline, powdery electrodeposit on the foil to increase its bond strength results in a considerably more uniform treatment than would otherwise be obtainable. The coverage of the treatment is not only even but is largely free of the longitudinal streaks normally observed in treating. In addition, the bond strength of the foil is not reduced by the hypochlorite treatment. Similarly, the subsequent application of a stainproofing treatment to foil which has previously been subjected to a hypochlorite treatment results in substantially more uniform stainproofing of the foil than would otherwise be obtainable.

Hypochlorite solutions for use in the present invention are conventionally purchased in concentrations in the order of 15 or more % by weight of hypochlorite. Where the preferred hypochlorite concentration of 5% is to be used, the commercially available hypochlorite solution should be diluted to the desired concentration, preferably with deionized or distilled water. The life of a batch of hypochlorite solution such as sodium hypochlorite at the preferred solution temperature (130°–140° F.) is approximately three hours. To maintain activity of the solution, approximately 1–2 gallons of fresh hypochlorite solution at the desired strength should be added at approximately half-hour intervals while removing an equal amount of spent solution.

As will be appreciated by those skilled in the art, it is advisable that no metal or organic material susceptible to attack by the hypochlorite be used in the processing equipment. Preferred materials for processing the copper foil are polyvinylchloride rollers with Teflon bearings and either polyvinylchloride or micarta roll supports. The hypochlorite tank utilized may be made of polyvinylchloride, polypropylene or any other inert material able to withstand the temperature of the treatment. The temperature of the hypochlorite may be maintained with a quartz thermostatically controlled immersion heater and circulation in the tank may be provided with a Teflon covered stirrer.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A process for improving the surface characteristics of copper foil comprising subjecting said foil to an aqueous sodium hypochlorite solution for a period of from about 5 to 30 seconds, said solution containing from about 2½ to 15% sodium hypochlorite and being maintained at a temperature of from about 110°–160° F.

2. A process as defined in claim 1 wherein, after said foil is subjected to said solution, said solution is removed from said foil by subjecting the foil to washing treatment for a sufficient period of time to avoid staining of the foil.

3. A process as defined in claim 2 wherein said washing treatment involves the use of a water wash, said washing treatment being carried out for a period of time in the order of twice the length of time that said foil is subjected to said solution.

4. A process as defined in claim 1 wherein, after subjecting said foil to said solution, said foil is subjected to an electrochemical treatment to coat at least one of its faces with a microcrystalline, powdery electrodeposit so as to improve its bond strength.

5. A process as defined in claim 1 wherein, after subjecting said foil to said solution, said foil is treated with an etching solution to etch away at least a portion of the surface of said foil, wherein said etching solution is not a hypochlorite solution.

6. A process as defined in claim 1 wherein said solution contains about 3–7% by weight of sodium hypochlorite, is at a temperature of about 130°–140° F., said foil being subjected to said solution for about 8–10 seconds.

7. A process as defined in claim 6 wherein said solution contains about 5% by weight of sodium hypochlorite, is at a temperature of about 130°–135° F., said foil being subjected to said solution for about 8–10 seconds.

8. Printed circuit grade copper foil produced by the process of claim 1.

9. A process for improving the etchability of copper foil which has been subjected to a chromate treatment comprising subjecting said foil to an aqueous alkali metal hypochlorite solution.

10. A process as defined in claim 9 wherein said solution is an aqueous sodium hypochlorite solution containing about 2½–15% by weight of sodium hypochlorite, said solution having a temperature of about 110°–160° F. and being in contact with said foil for about 5–30 seconds.

11. A process as defined in claim 10 wherein, after subjecting said foil to said solution, said foil is treated with an etching solution to etch away at least a portion of the surface of said foil.

12. Printed circuit grade copper foil produced by the process of claim 10.

13. A process as defined in claim 9 wherein, after subjecting said foil to said solution, said foil is treated with an etching solution to etch away at least a portion of the surface of said foil.

14. Copper foil produced by the process of claim 9, wherein the foil has been subjected to said hypochlorite solution for a period of time sufficient to remove only a portion of the coating formed by said chromate treatment.

15. A process for improving the surface characteristics of copper foil comprising subjecting said foil to an aqueous sodium hypochlorite solution and then subjecting said foil to an electrochemical treatment to coat at least one of its faces with a microcrystalline, powdery electrodeposit so as to improve its bond strength.

16. A process for improving the surface characteristics of copper foil comprising subjecting said foil to an aqueous sodium hypochlorite solution then treating said foil with an etching solution to etch away at least a portion of the surface of said foil, wherein said solution is not a hypochlorite solution.

* * * * *